US 6,639,461 B1

United States Patent
Tam et al.

(10) Patent No.: US 6,639,461 B1
(45) Date of Patent: Oct. 28, 2003

(54) ULTRA-WIDEBAND POWER AMPLIFIER MODULE APPARATUS AND METHOD FOR OPTICAL AND ELECTRONIC COMMUNICATIONS

(75) Inventors: Alan K. Tam, Irvine, CA (US); Binneg Y. Lao, Rancho Palos Verdes, CA (US)

(73) Assignee: Sierra Monolithics, Inc., Redondo Beach, CA (US)

( * ) Notice: Subject to any disclaimer, the term of this patent is extended or adjusted under 35 U.S.C. 154(b) by 90 days.

(21) Appl. No.: 09/943,588

(22) Filed: Aug. 30, 2001

(51) Int. Cl.$^7$ ................................. H03F 3/38
(52) U.S. Cl. .................. 330/10; 330/51; 330/133; 330/134; 330/286; 330/302; 330/310
(58) Field of Search ................ 330/133, 134, 330/286, 302, 310, 10, 51

(56) References Cited

U.S. PATENT DOCUMENTS

| | | | |
|---|---|---|---|
| 3,879,691 A | * 4/1975 | Fritz | 333/182 |
| 4,994,757 A | 2/1991 | Bickley et al. | |
| 5,062,150 A | 10/1991 | Swanson et al. | 359/152 |
| 5,126,688 A | 6/1992 | Nakanishi et al. | |
| 5,221,908 A | 6/1993 | Katz et al. | 330/149 |
| 5,469,454 A | 11/1995 | Delfyett, Jr. | 372/18 |
| 5,523,715 A | * 6/1996 | Schrader | 330/10 |
| 5,586,208 A | 12/1996 | Nishiyama | 385/93 |
| 5,611,008 A | 3/1997 | Yap | 385/14 |
| 5,764,679 A | 6/1998 | Shen et al. | 372/69 |
| 5,838,158 A | 11/1998 | Beck et al. | 324/636 |
| 5,973,557 A | * 10/1999 | Miyaji et al. | 330/51 |
| 5,999,057 A | * 12/1999 | Carlsson et al. | 330/279 |
| 6,002,510 A | 12/1999 | Ishizaka | 359/248 |
| 6,013,537 A | 1/2000 | Kuchta | 438/18 |
| 6,172,567 B1 | * 1/2001 | Ueno et al. | 330/285 |
| 6,216,012 B1 | 4/2001 | Jensen | 455/553 |
| 6,222,427 B1 | * 4/2001 | Kato et al. | 333/185 |
| 6,222,503 B1 | 4/2001 | Gietema | 343/890 |
| 6,329,879 B1 | * 12/2001 | Maruyama et al. | 330/289 |
| 6,339,702 B1 | * 1/2002 | Izumiyama | 455/115 |

* cited by examiner

Primary Examiner—Michael Tokar
Assistant Examiner—Linh V Nguyen
(74) Attorney, Agent, or Firm—Hogan & Hartson L.L.P.

(57) ABSTRACT

A broadband power amplifier module for high bit-rate SONET/SDH transmission channels, such as OC-192 and OC-768 applications. The power amplifier module, or also frequently referred to as modulator driver module, comprises amplifiers connected in series to amplify an input signal. A bias tee circuit is incorporated into the power amplifier module by connecting a conical shape inductor between the output stage of the amplifiers and the supply voltage and connecting a pair of blocking capacitors also at the output stage of the amplifiers. The conical shape inductor is adapted to provide high impedance over the entire bandwidth. The capacitors are adapted to provide high self-resonant frequency that is approaching or exceeding the bandwidth frequency. A power detection circuit can also be incorporated into the power amplifier module at the output stage of the amplifiers. The power detection circuit has a voltage divider circuit connected between the output stage and a ground supply. The divider circuit taps off a portion of the energy from the output stage to be measured by a detection diode. A ¼-wave radial matching stub is connected to the detection diode to filter RF energy. Another ¼-wave matching stub is connected to the divider circuit to provide grounding. Capacitors are also connected to the output of the detection diode to filter noise in the detector output voltage over a entire frequency bandwidth.

34 Claims, 12 Drawing Sheets

ULTRA-WIDEBAND POWER AMPLIFIER MODULE APPARATUS AND METHOD FOR OPTICAL AND ELECTRONIC COMMUNICATIONS

FIELD OF THE INVENTION

The present invention relates to power amplification devices for optical and electronic communications network, and more specifically to super-wideband power amplifier and modulator driver modules for high bit-rate SONET/SDH transmission channels.

BACKGROUND OF THE INVENTION

Recently, the world has witnessed a phenomenal growth in the number of Internet users, applications and devices and in the amount of data traffic especially that of medium-rich content—all demanding higher speed communications and connectivity over the Internet. To accommodate this demand, network carriers have begun to provide fiber optical channels to achieve ultra high speed communications.

FIG. 1 is a simplified block diagram showing the physical media dependent and PHY layers of an optical network interface. The optical signals sent along the fiber optical channels, e.g. at OC-192 rate, are detected and received by receiver that includes the detector 10 and the transimpedance amplifier 11. After an optical signal is converted, which is then amplified to an electrical signal in the receiver, the clock signal and data are recovered by a clock and data recovery unit 12. The recovered serial data signal is demultiplexed by the DEMUX 13 down to a lower-speed parallel data stream which is then forwarded to a framing and protocol handling unit 14, for network processing.

On the transmitter's side, parallel data generated from network processing are multiplexed up to higher speed serial data by MUX 18, which also multiplies the data clock speed to the serial data rate. The serial data signals are then amplified by the modulator driver 17 and the power amplifier 16 to a level sufficient to drive the optical modulator 15. The required level is typically 7 to 8 volts peak to peak to drive a LiNbO$_3$ modulator. The modulator 15 then modulates a continuous-wave (CW) laser beam into on- or off-intervals each of which representing a digital 1 or 0 respectively. To improve output voltage swings for RF signals, the output of power amplifier 16 is typically connected to a bias tee circuit. The reason for using the bias tee is as follows: For a single chip implementation of the power amplifier 16, its last stage consumes most of the current. In order to isolate this stage from the rest of the amplifier, a resistive network with shunting capacitors is normally used on chip to supply its power. The drawback of this approach is that due to the large current draw of the last stage, the resistive network causes a significant voltage drop, which in turn limits the peak-to-peak swing of its output. A bias tee then is used to provide the power supply directly to the last stage. A bias tee circuit consists of only passive components. Its function is to provide a DC block between its input and output and a DC bias voltage to its input node. The method of providing the DC voltage to its input node has to be such that it does not affect the RF signal going from the input to the output and that no appreciable DC voltage drop occurs between the voltage source and the input of the bias tee under high current draw conditions.

Also, in order to monitor the level of voltage swing applied to the modulator 15, a power detector, which detects power levels for a wide band of RF frequencies, is typically implemented with the power amplifier 16.

FIG. 2 is a simplified circuit diagram of a conventional bias tee for RF applications. For application in optical communications, the data can have a long string of "0s" or "1s" or alternate single 0 and 1. Therefore its frequency can be as low as tens of KHz or as high as tens of GHz, e.g. from 30 KHz to 15 GHz for OC-192 and from 30 KHz to 50 GHz for OC-768. Thus wide band bias tees have to be used. To achieve wideband performance, a conventionally designed bias tee may need multiple inductors in series and multiple capacitors in parallel in order to cover the required wide frequency range. For example, one inductor L1 for 30 kHz to a few MHz, one L2 for a few MHz to 1 GHz and a third one L3 for 1 GHz to 15 GHz. Also, 3 capacitors, ranges from 0.1 uF to 1 pF, may be needed to cover the same bandwidth with the smaller one covering the higher frequency range. As can be appreciated by those skilled in the art, because of the use of multiple discrete components, a bias tee package for ultra wide bandwidth applications will end up with a physical dimension in excess of 1.5"×1.5". This is quite bulky and prone to RF loss due to inherent parasitic capacitances associated with the large size of these components. Large size is especially undesirable for use in optical transponders as the entire transponder size is only around 3"×5" or less.

FIG. 3 is a simplified circuit diagram of a conventional power detector for RF applications. Power detectors generally need to be in hermetically sealed packaging, with external RF feedthroughs at input and output, as well as an external coupler to couple RF energy. All these connected together end up with a package that tends to be quite bulky and costly. Most commercial power detectors also have limited bandwidth, insufficient for application in optical or electronic communications. Prior attempts to integrate the bias tee and power detector circuits into MICs such as power amplifiers or modulator drivers for ultra-wide bandwidth applications have not been entirely successful, largely due to the physical and performance limitations of the discrete components such as inductors and capacitors.

Therefore, for size and cost reduction there is a need to incorporate the bias tee into an MMIC package such as a power amplifier module in order to reduce overall size, and cost without compromising on performance.

There is also a need to incorporate the power detector into an MMIC package such as a power amplifier module for the same reason.

There is further a need to incorporate both the bias tee and power detector circuits into the same MMIC package such as a power amplifier module.

SUMMARY OF THE INVENTION

A broadband power amplifier module for high bit-rate SONET/SDH transmission channels, such as OC-192 and OC-768 applications, is disclosed. The power amplifier module, or also frequently referred to as modulator driver module, comprises first and second amplifiers connected in series to amplify an input signal. A bias tee circuit is incorporated into the power amplifier module by connecting a conical shape inductor between the output stage of the amplifiers and the supply voltage and connecting a pair of blocking capacitors also at the output stage of the amplifiers. The conical shape inductor is adapted to provide high impedance over the entire bandwidth. The capacitors are adapted to provide high self-resonant frequency that is approaching or exceeding the bandwidth frequency.

Additionally, a power detection circuit can also be incorporated into the power amplifier module at the output stage of the amplifiers. The power detection circuit has a voltage divider circuit connected between the output stage and a ground supply. The divider circuit taps off a portion of the energy from the output stage to be measured by a detection diode. A ¼-wave radial matching stub is connected to the detection diode to filter RF energy. Another ¼-wave matching stub is connected to the divider circuit to provide grounding. Capacitors are also connected to the output of the detection diode to filter noise in the detector output voltage over a entire frequency bandwidth.

DETAILED DESCRIPTION OF THE INVENTION

The present invention provides a power amplifier module with a bias tee for ultra-wide bandwidth applications. The power amplifier module may further incorporate a power detector circuit for ultra-wide bandwidth application. In the following detailed description, numerous specific details are set forth to provide a full understanding of the present invention. It will be obvious, however, to one skilled in the art that the present invention may be practiced without some of these specific details. In other instances, well-known structures and techniques have not been shown in detail so as to avoid unnecessarily obscuring the present invention. It should also be appreciated by those skilled in the art of optical communications that the terms "power amplifier module" and "modulator driver module" are used interchangeably in connection with amplifying signals to drive an optical modulator. In the following description, a reference to "power amplifier module" should therefore be understood as reference to "modulator driver module" by those skilled in the art. Further, although the description makes reference to embodiments as applied to optical carrier ("OC") applications, it should be apparent to those skilled in the art that the invention can also be applicable to high bit-rate electronic communication applications, where design specifications such as small signal gain, group delay, output voltage swings and ripples are taken into consideration.

Figure 1:
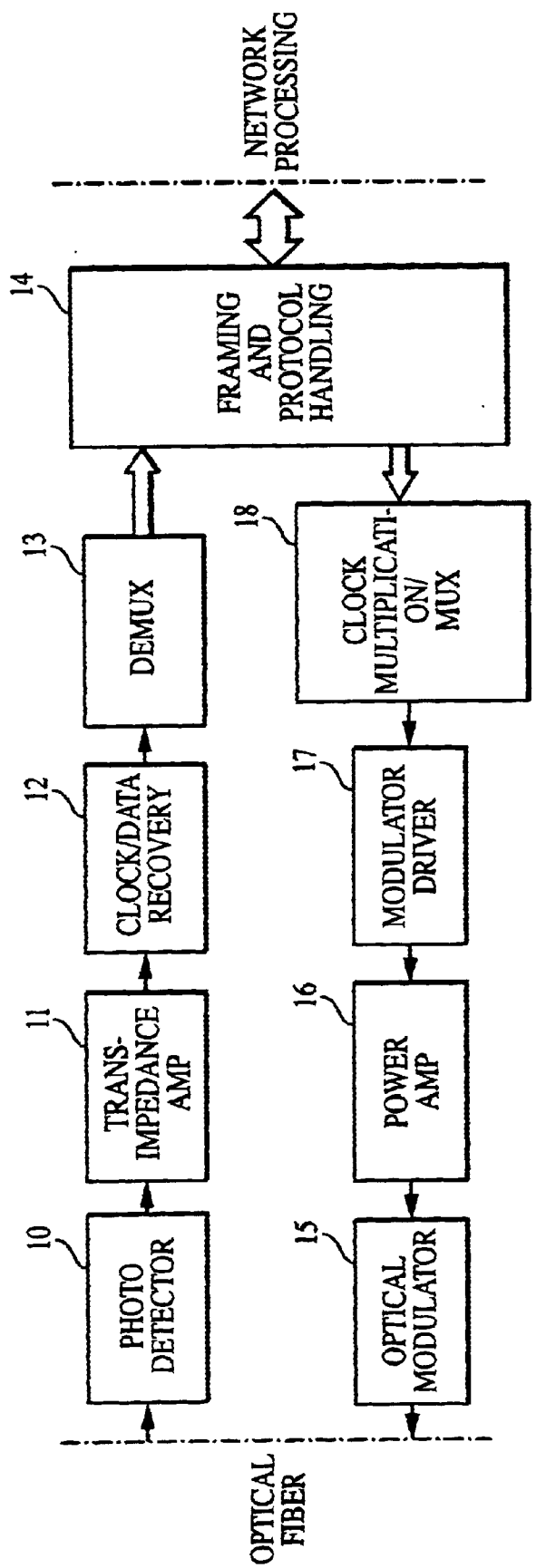
FIG. 1 is an exemplary block diagram representing a PHY layer of the network interface topology.
Figure 2:
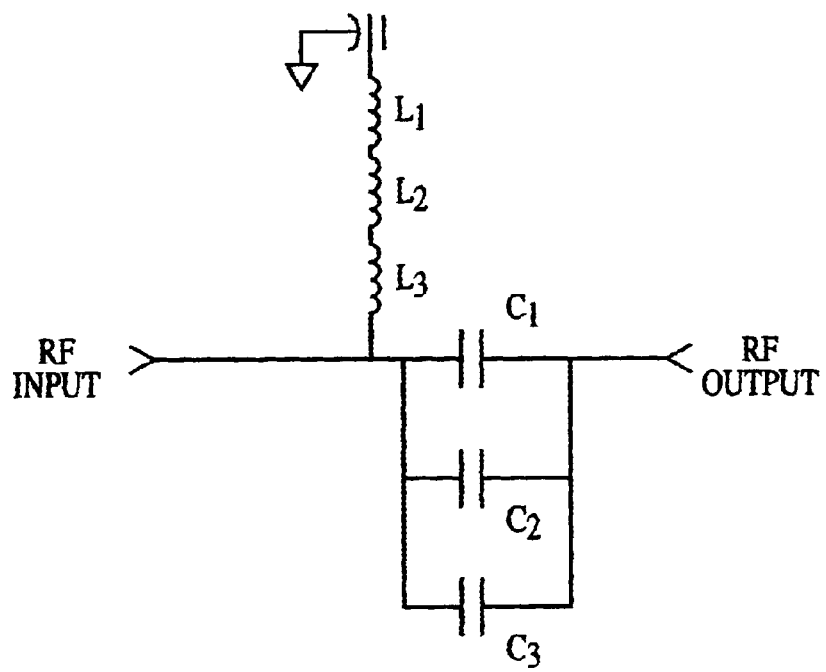
FIG. 2 is an exemplary schematics diagram of a conventional bias tee circuit.
Figure 3:
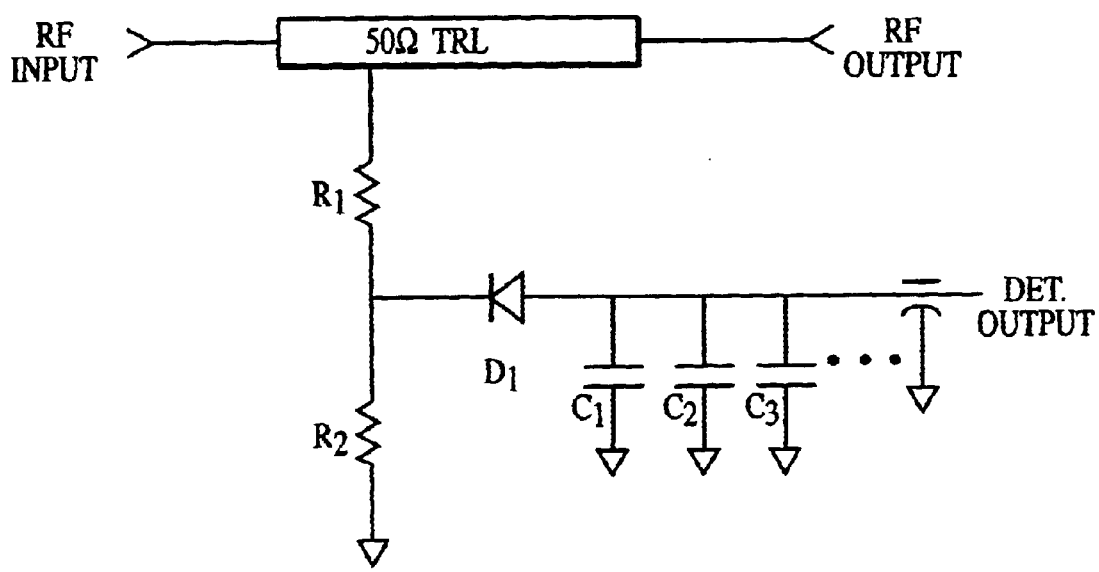
FIG. 3 is an exemplary schematics diagram of a conventional power detector circuit.
Figure 4:
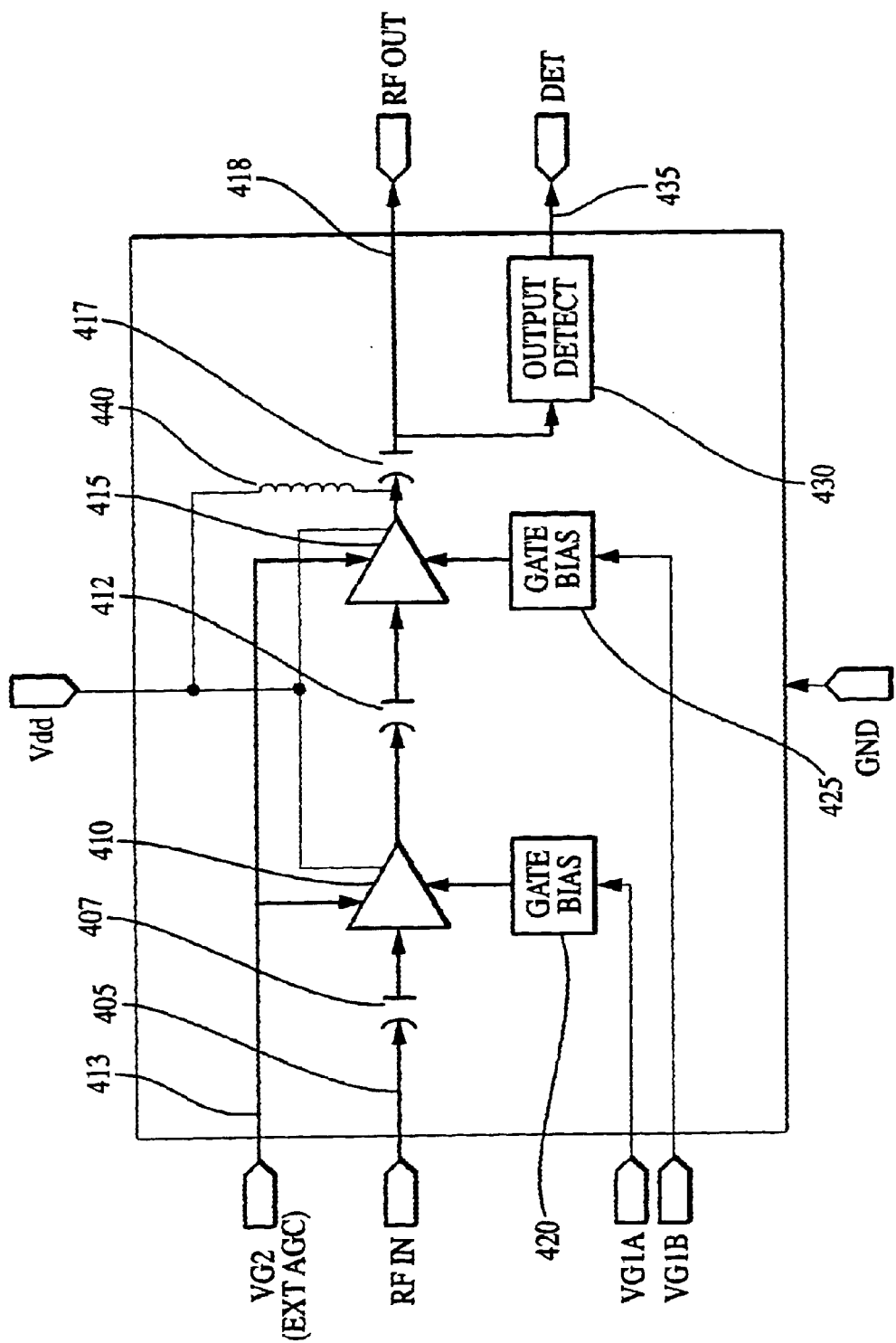
FIG. 4 is an exemplary block diagram representing a power amplifier module in accordance with one embodiment of the present invention.

Reference is made to FIG. 4, where an exemplary simplified functional block diagram for an ultra-wide bandwidth (30 KHz–15 GHz for OC-192, or 30 KHz–50 GHz for OC-768) power amplifier module in accordance with the present invention is shown. Input signal RF In 405 is applied to first stage amplifier 410 and second stage amplifier 415 through blocking capacitors 407, 412, respectively. Output signal RF Out 418 is led from second stage amplifier 415 through blocking capacitor 417. Gate bias voltages VG1A, VG1B are applied first stage amplifier 420 and second stage amplifier 425 through gate bias connections 420 and 425, respectively. External AGC input control voltage VG2 413 is applied to both first stage amplifier and second stage amplifier. Power Detection circuit 430 is connected to detect output level of output signal RF Out 418 throughout the desired range of different frequencies. The bias tee circuit consists of inductor 440 and capacitor 417. It connects its inductor 440 to the output of second stage amplifier 415. This provides a direct DC path between the power supply Vdd and the last stage of the amplifier 415. The direct connection enables the output of amplifier 415 to swing fully in voltage to an extent which is sufficient to drive an optical modulator. The inductor 440 is preferably constructed with a large enough impedance over the wide bandwidth as required for optical and electronic communication so that signals do not leak through to the power supply Vdd.

Currently, the packaging for the power amplifier module in accordance with the present invention uses SMA connectors for RF In and RF Out. It utilizes solder tab-type connector for the ground DC GND return. It also utilizes coaxial feed-through connectors, which filter out noise in the cavity, for gate biases, detected RF voltage, AGC input control voltage and power supply Vdd. The power amplifier module has a dimension of 1.25"(L)×0.7" (W)×0.5" (D) in accordance with one embodiment of the present invention. Of course, those skilled in the art can determine the most suitable connector types for their packaging and connectors bases on their operating environment.

Figure 5:
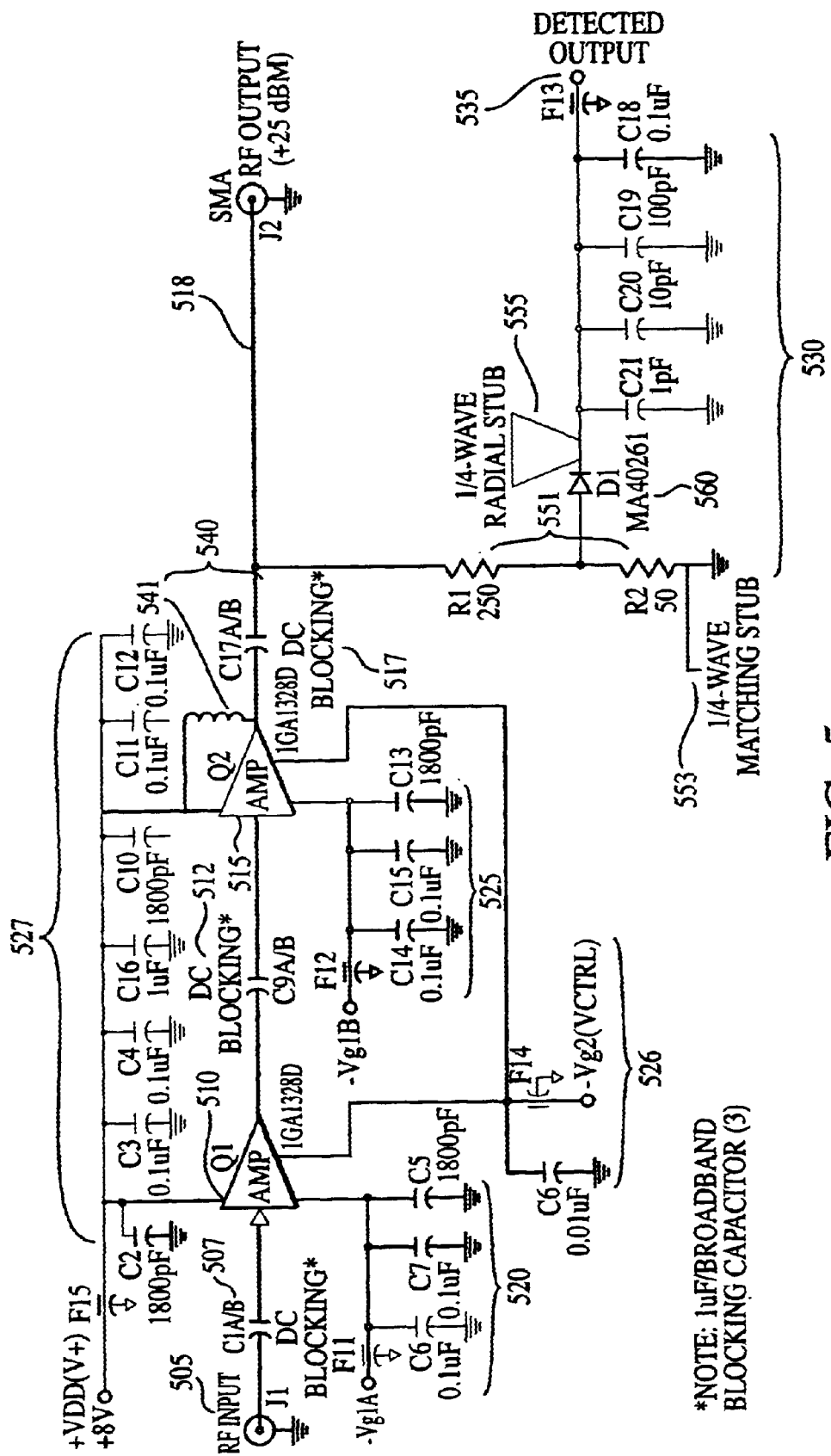
FIG. 5 is an exemplary schematics diagram of a power amplifier module for high speed optical modulators in accordance with the present invention.

Reference is now to FIG. 5, where an exemplary schematics diagram of the power amplifier module in accordance with the present invention is shown. RF input 505 is applied to first stage amplifier 510 and second stage amplifier 515 through DC blocking capacitors 507 and 512, respectively. The output of second stage amplifier 515 is connected to bias tee circuit 540 to generate RF output 518, which may also be applied to power detector circuit 530. Currently, amplifiers 510, 512 are medium power wideband amplifiers from Triquint Semiconductor (http://www.triquint.com) at 2300 N.E. Brookwood Parkway, Hillsboro, Oreg. 97124, under the part number of TGA1328-EPU. Of course, those skilled in the art may find other wideband amplifiers suitable for their applications based on the teaching of the present invention.

The amplifiers 510, 515 are powered by Vdd through DC bypassing circuit 527. Bias voltages are applied to amplifiers 510 and 515 through DC bypassing circuits 520 and 525, respectively. Of course, if more gain is desired, more amplifiers can be inserted into the module package. As shown in FIG. 5, DC bypassing circuit 520 is formed by capacitors C5, C6, C7 in parallel. Similarly, DC bypassing circuit 525 is formed by capacitors C13, C14, C15 in parallel and DC bypassing circuit 527 is formed by capacitors C2, C3, C4, C10, C11, C12, C16 in parallel. The bypassing capacitor circuits serve to filter out noise in the DC power supply Vdd. They also serve to short-circuit the RF signal on the power line to ground so different amplifier stages or blocks do not couple to each other undesirably to cause oscillations. Capacitors of different values serve to short-circuit different frequency bands.

Referring to FIG. 5, bias tee circuit 540 is formed by connecting conical inductor 541 between the output of second stage amplifier 515 and Vdd, and by applying the output from amplifier 515 to capacitors 517. Capacitors 517 provide DC blocking so that only RF energy is passed through to the output 518. Currently, to achieve high self-resonant frequency without creating dips in the frequency response, capacitors 517 are two chip capacitors connected in parallel to allow passing of signals in both the low frequency range (KHz–a few MHz) and the high frequency range (a few MHz–15 GHz). Such chip capacitors, and DC blocking capacitors 507, 512, are ultra broadband DC blocking capacitors available from Dielectric Labs (http://www.dilabs.com) as individual units (Part No.: C08BLBB1X5UX), or as combined units known as Opti-Caps™. Dips in the frequency response occur when capacitors have gaps in their coverage or low self-resonant frequency such that the gain reduces at one or more region within the desired bandwidth. Preferably, the self-resonant frequency of the one that covers the high frequency should be much higher than the highest frequency of the desired abandwidth to avoid dips within the operating frequency band.

Reference is to bias tee circuit 540 of FIG. 5. For a bias tee circuit in an ultra wide bandwidth applications, the inductor should preferably provide high impedance at low frequency as well as at high frequency over the desired bandwidth. The difficulty in achieving high impedance over a wide bandwidth lies in the physical realization of an inductor. In order to achieve high impedance (200Ω) at the low frequency limit (say 50 KHz) we need 0.64 mH. This would be a physically large inductor with a ferrite core and a low self-resonance frequency. Consequently it will be capacitive at high GHz frequencies and provide low impedance. Thus for wideband coverage one needs to use a number of inductors in series, starting from the amplifier output node with a small inductor with small value (say 1 nH), high self resonance frequency, or low parasitic capacitance. Then one gradually increases the inductance of each of successive inductors until 0.64 mH is reached for the lowest frequency. In this approach one also has to be careful that no gaps of coverage is created by incrementing the inductor values too much in going from one inductor to the next.

A more preferable approach is to replace the series of inductors of successively increasing values by a single conical inductor, preferably mounted on a ceramic stand. In a conical inductor, the tip portion with its small dimension corresponds to an inductor with relatively low inductance, low parasitic capacitance, and high self-resonance frequency. Since the impedance of an inductor is proportional to the frequency, its low inductance still provides high impedance for the high end of the frequency range. As we go away from the tip, successive sections provide the required impedance for successively lower frequencies. In the current embodiment, inductor 541 is such a broadband conical inductor, which has a bandwidth extending from 10 MHz to 40 GHz and which is available as Model No. C011, from Piconics Inc, at 26 Cummings Road, Tyngsboro Mass. 01879. Without an inductor with such characteristics, multiple discrete inductors would have been needed to cover the ultra wide bandwidth, thus greatly increasing the physical dimension and potential RF loss.

For improved low-frequency coverage, e.g. at 20 KHz or 50 KHz, an inductor (e.g. a toroidal or a solenoidal inductor) with an exemplary value of 1 mH may be inserted between the conical inductor 541 and power supply Vdd. Those skilled in the art can, of course, determine the appropriate value for the inductor in their application to achieve the desired low frequency coverage. For example, a 1 mH toroidal inductor may be used in the module package, since it is generally considered more efficient due to its size advantage over a solenoidal inductor.

Reference is now to power detector circuit 530 of FIG. 5. Power detector 530 may be incorporated into the power amplifier module for detection of RF energy at all frequencies. This would result in size and cost reduction when compared with using a separate module for power detection. As shown in FIG. 5, voltage divider circuit 551 is used to tap off the RF energy to be detected to prevent damage to power detector diode 560. Currently, by a ratio of R1:R2=250:50, RF power being applied to detector diode 560 is limited to about 2 to 3% of the total RF power. It should be noted that while a resistor voltage divider circuit 551 is illustrated to achieve broader bandwidth capability for both input and output, those skilled in the art may apply other types of voltage dividers for their desired bandwidth. Also, instead of connecting between output node 518 and ground, voltage divider circuit 551 may be connected to a second voltage supply source, in place of ground, to bias detection diode 560.

Currently, grounding of voltage divider circuit 551 is achieved through a via hole to the backside ground of the substrate. However, due to the inductance associated with the via hole, this grounding may be compromised at high end of the frequency band. To achieve better flatness of frequency response, a ¼-wave stub 553 is connected at the end of divider circuit 551 for better grounding at the high frequency end in addition to the via hole. The RF energy that is tapped off from the voltage divider circuit 551 is applied to detector diode 560 so that the RF energy is converted into a DC voltages which is indicative of the RF power level at the output 518. A ¼-wave radial stub 555 serves as a broadband low-pass filtering for detector diode output. This would suppress all the higher frequency components.

Capacitors C18, C19, C20, C21 provide proper low-pass filtering for lower frequency bands and minimize amplitude variation of the diode output over frequency. As such, a fairly constant DC voltage over the bandwidth can be maintained. It should be noted that different values, e.g. 0.1 uF, 1 pF, 10 pF, 100 pF of capacitors are used to cover different frequencies, since the larger the capacitance, the better it filters at lower frequency range. For example, stub 555 is for 10 to 15 GHz, 1 pF is for 2–10 GHz, 10 pF is for 0.5–2 GHz, 100 pF is for a few hundred MHz and below, 0.1 uF is for 1 MHz or below. For even higher frequency range of 40 GHz, more stubs can be added.

Figure 6:
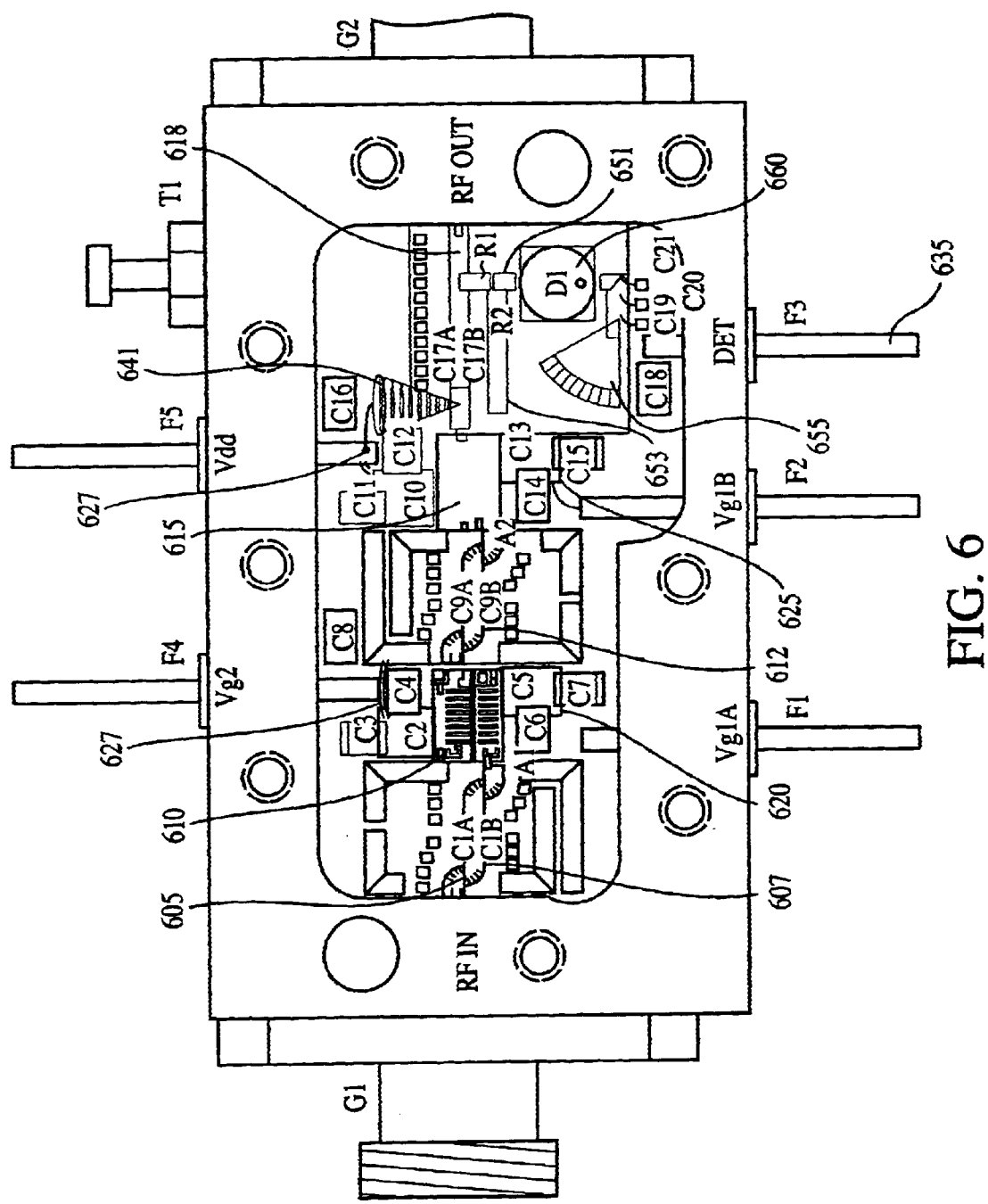
FIG. 6 is an exemplary simplified diagram showing an exemplary assembly packaging of a power amplifier in accordance with the present invention.

Reference is made to FIG. 6, where an exemplary assembly diagram of a power amplifier module is shown. RF Input 605 is applied to first stage amplifier 610 through a 50-ohm transmission line and DC blocking capacitors 607. Second stage amplifier 615 is connected to first stage amplifier 610 through another 50-ohm transmission line and DC blocking capacitors 612. RF Out is led through 50-ohm transmission line 618 from second stage amplifier 615. It is also tapped off by resistor divider 651 with ¼-wave grounding stub 653 and detected by detector diode 660 with ¼-wave radial stub 655. The detected output can be measured at connector 635. The low-pass filtering capacitors for the power detector are implemented with capacitors C18/C19/C20/C21. It should, however, be appreciated by those skilled in the art that FIG. 6 provides merely one exemplary embodiment of the present invention and that the present invention may be practiced with or without some of these specific details.

Conical inductor 641 is connected between output of second amplifier 615 and Vdd. Bypass capacitors 620, 625, 627 are represented by capacitors C5/C6/C7, C13/C14/C15, C2/C3/C4/C10/C11/C12/C16, respectively. Blocking capacitors Cl7A/C17B are connected between the resistor divider network 651 and the output of amplifier 615. A packaged power amplifier module such as the one shown in FIG. 6 may weigh about 2 ounces according to one embodiment of the present invention.

While the assembly diagram of FIG. 6 illustrates one embodiment of a power amplifier module with bias tee and power detector incorporated, it should be appreciated by those skilled in the art that other assemblies can be implemented based on the teaching of the present invention. For example, the bias tee may be incorporated in a power amplifier and the power detector may be applied to a modulator driver module, or other MMIC where it would be beneficial to be able to ensure its functionality.

Figure 7:
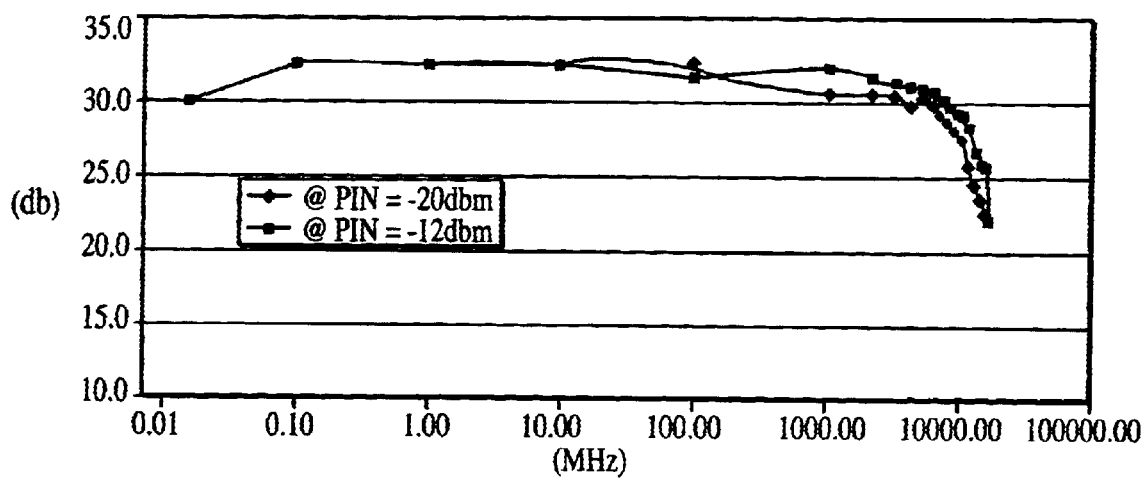
FIG. 7 is an exemplary graph showing small signal gain of a power amplifier module in accordance within the present invention from 30 KHz to 12.5 GHz.

FIG. 7 is an exemplary graph showing small signal gain of a power amplifier module in accordance within the present invention from 30 KHz to 12.5 GHz.

Figure 8:
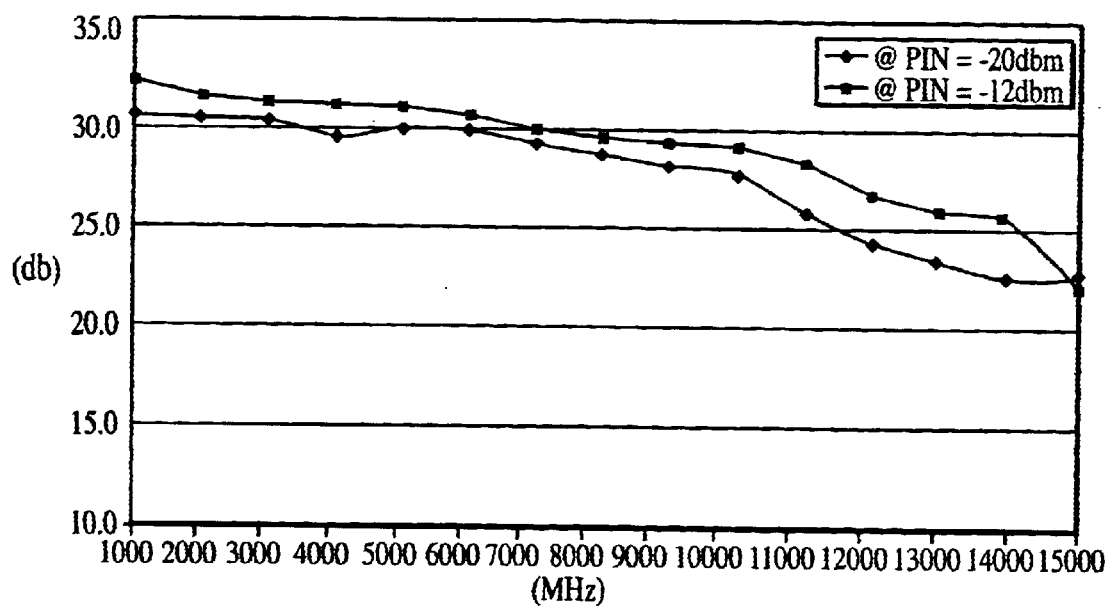
FIG. 8 is an exemplary graph showing small signal gain of a power amplifier module in accordance with the present invention from 1 GHz to 15 GHz.

FIG. 8 is an exemplary graph showing small signal gain of a power amplifier module in accordance with the present invention from 1 GHz to 15 GHz.

Figure 9:
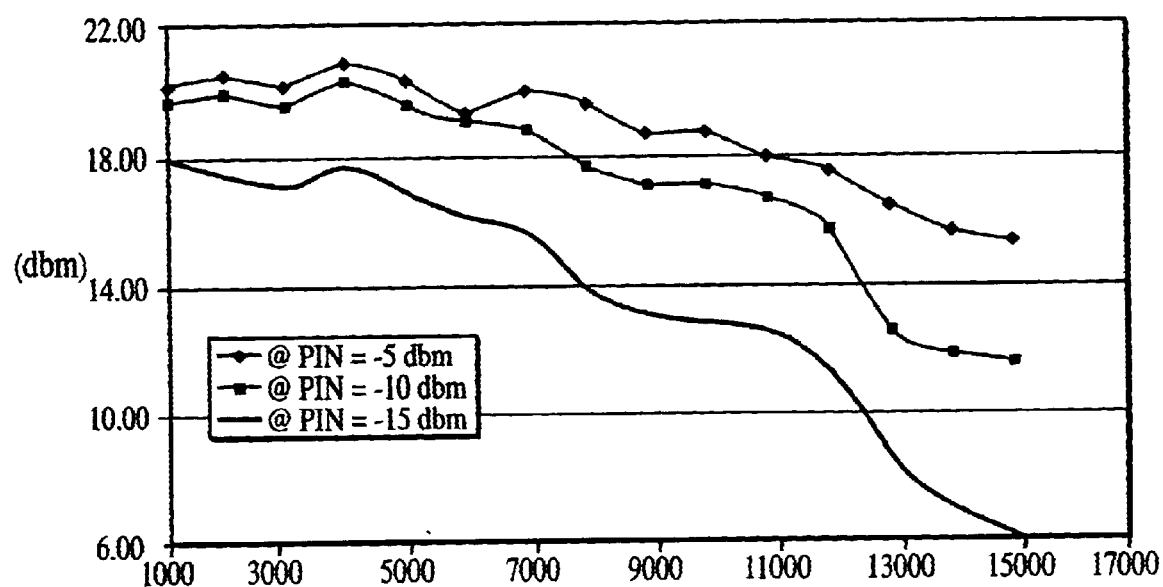
FIG. 9 is an exemplary graph showing output power level of a power amplifier module in accordance with the present invention from 1 GHz to 15 GHz.

FIG. 9 is an exemplary graph showing output power level of a power amplifier module in accordance with the present invention from 1 GHz to 15 GHz.

Figure 10:
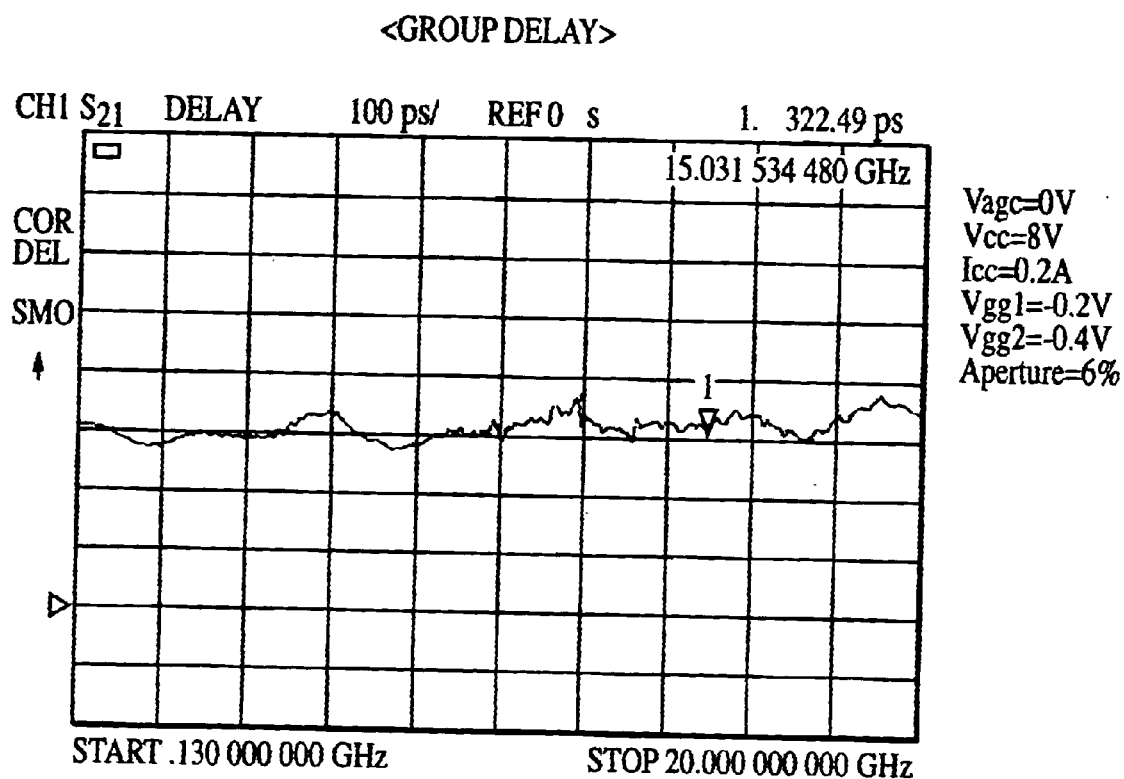
FIG. 10 is an exemplary graph showing the group delay of a power amplifier module in accordance with the present invention over a frequency range from 130 MHz to 15 GHz.

FIG. 10 is an exemplary graph showing the group delay of a power amplifier module in accordance with the present invention over a frequency range from 130 MHz to 15 GHz.

Figure 11:
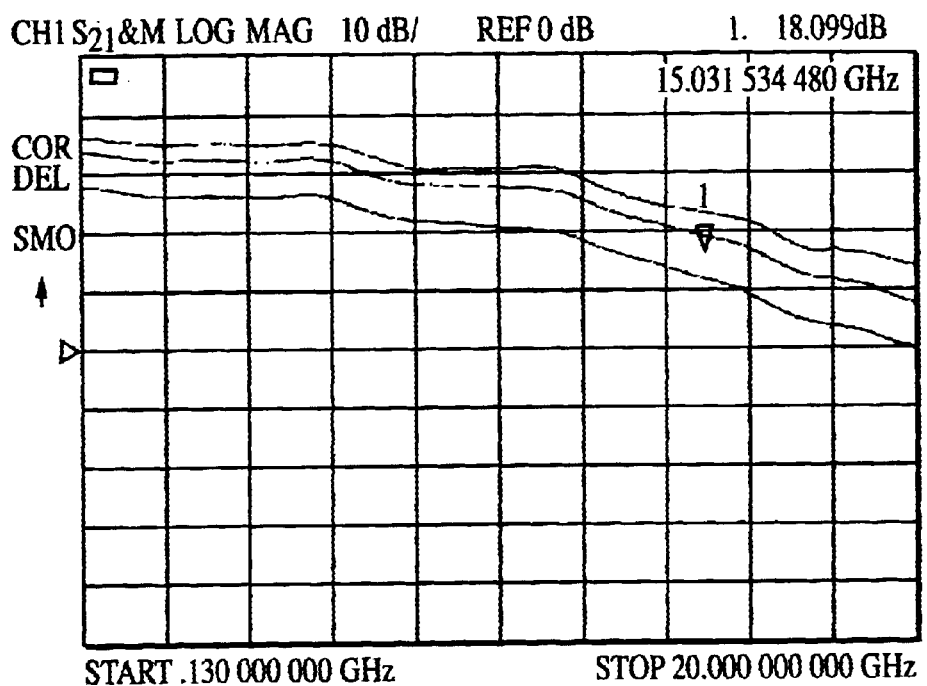
FIG. 11 is an exemplary graph showing small signal gain vs. AGC voltage of a power amplifier module in accordance with the present invention over a frequency range from 130 MHz to 15 GHz.

FIG. 11 is an exemplary graph showing small signal gain vs. AGC voltage of a power amplifier module in accordance with the present invention over a frequency range from 130 MHz to 15 GHz.

Figure 12:
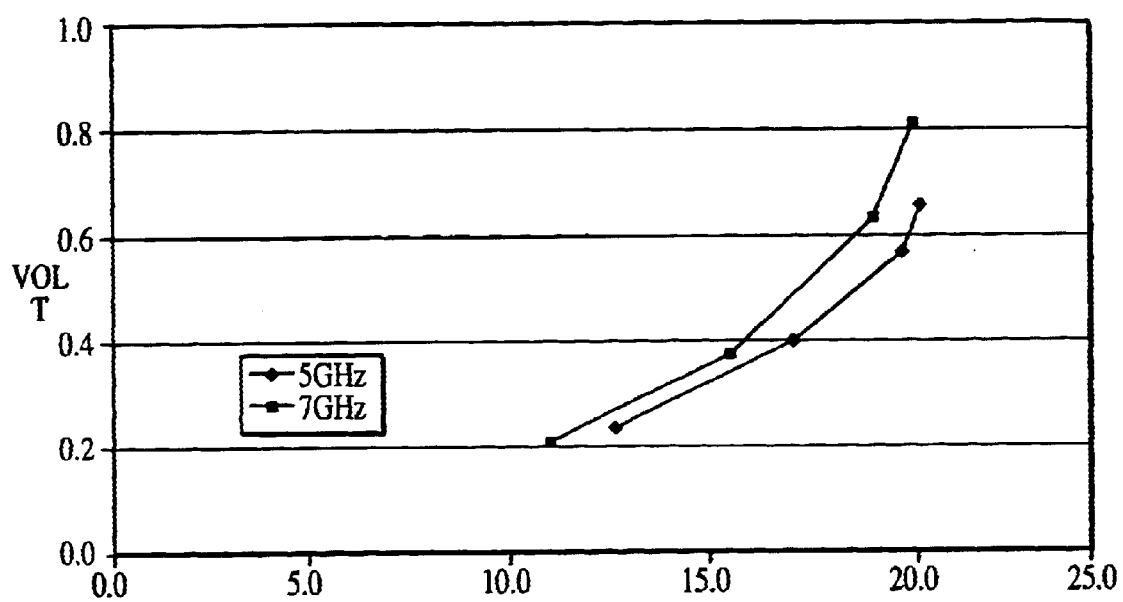
FIG. 12 is an exemplary graph showing detector voltage vs. output power of a power amplifier module in accordance with the present invention at 5 GHz and at 7 GHz.

FIG. 12 is an exemplary graph showing detector voltage vs. output power at 5 GHz and at 7 GHz.

Figure 13:
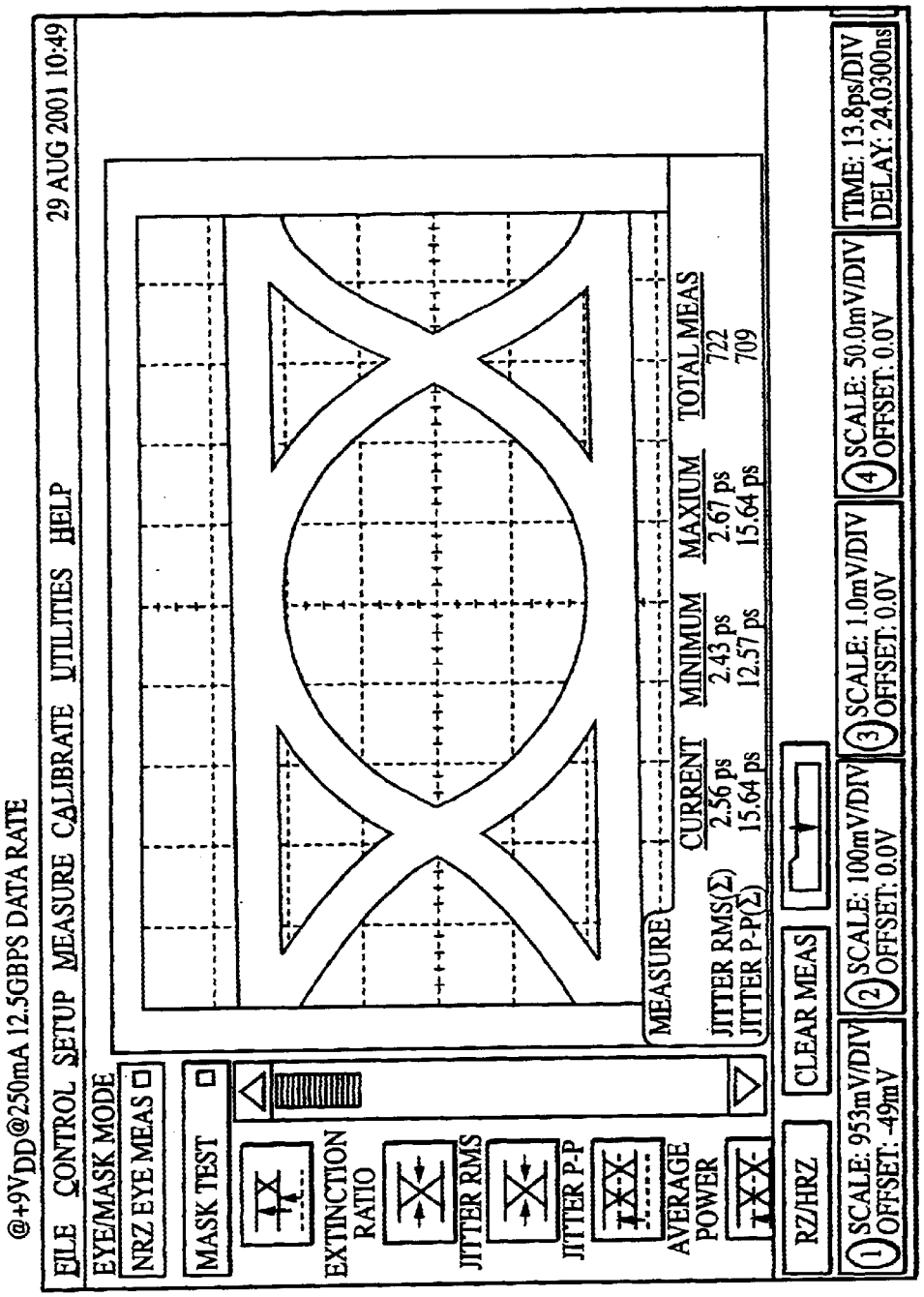
FIG. 13 is an exemplary eye diagram of a power amplifier module in accordance with one embodiment of the present invention.

FIG. 13 is an exemplary eye diagram of a power amplifier module in accordance with one embodiment of the present invention. In this example, an input signal of about 250 mV peak-to-peak was provided to the node 505 in FIG. 5. The input signal was a pseudo random bit data stream that was $2^{31}-1$ PRBS. The data rate was 12.5 Gbps. The power supply was at 9 V peak-to-peak, and the current was 250 mA. The overall power dissipation was about 2.25 Watt. The waveform observed at the output node 518 of FIG. 5 is shown in FIG. 13. The output waveform is about 5 V peak-to-peak. The test setup used to generate the waveform shown in FIG. 13 did not include the inductor 541 in FIG. 5. If the inductor 541 is included, the output amplitude is expected to be even larger (e.g., 7 V peak-to-peak).

Figure 14:
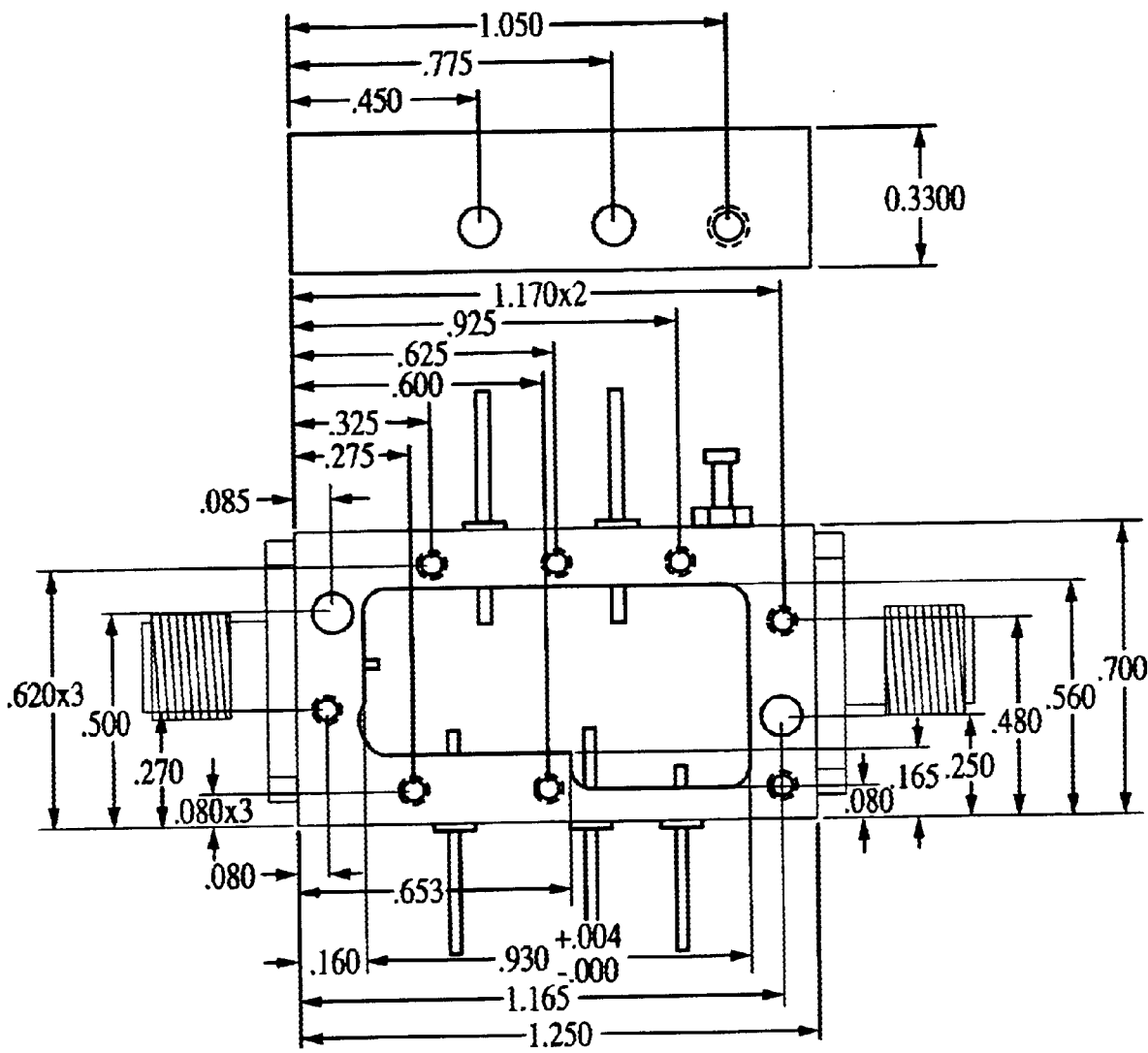
FIG. 14 is an exemplary assembly packaging of a power amplifier in accordance one embodiment of the present invention.

FIG. 14 is an exemplary assembly packaging of a power amplifier in accordance with one embodiment of the present invention. The dimensions shown are in inches.

While the present invention has been particularly described with reference to the various figures and embodiments, it should be understood that these are for illustration only and should not be taken as limiting the scope of the invention. There may be many other ways to implement the invention. Many changes and modifications may be made to the invention, by one having ordinary skill in the art, without departing from the spirit and scope of the invention.

What is claimed is:

1. A broadband power amplifier module for high bit-rate SONET/SDH transmission channels, comprising:

at least one cavity with at least an input terminal and an output terminal;

a plurality of amplifiers disposed within said cavity, said plurality of amplifiers being connected in series from said input terminal to said output terminal;

at least one conical inductor disposed within said cavity, connected between an amplifier output node of said amplifiers and a first supply voltage source, said conical inductor having a generally predetermined impedance over a predetermined bandwidth;

a first plurality of capacitors disposed within said cavity, connected between said amplifier output node and said output terminal, at least one of said plurality of capacitors having a predetermined self-resonant frequency that is at least approaching said predetermined bandwidth frequency.

2. A power amplifier module of claim 1, wherein said first plurality of capacitors are chip capacitors connected in parallel, said first plurality of capacitors collectively being operative in providing DC blocking to signals in a frequency range from 30 KHz to 15 GHz.

3. A power amplifier module of claim 1, further comprising a power detector circuit disposed within said cavity and connected to a node formed by the said plurality of capacitors and said output terminal, said power detector circuit comprising:

a resistor divider connected between said output node and a second supply voltage source, said divider adapted to generate a detector input voltage that is of a predetermined fraction of a signal at said output node;

a ¼-wave matching stub connected to a node formed between said resistor divider and said second supply voltage source;

a detection diode adapted to detect voltage levels of said detector input voltage to generate a detector output voltage;

a second plurality of capacitors coupled to said detector diode, each of said second plurality of capacitors being adapted to filter noise in said detector output voltage over a predetermined frequency bandwidth;

a ¼-wave radial stub also coupled to said detector diode, said radial stub being adapted to filter noise in said detector output voltage over a predetermined frequency bandwidth.

4. A power amplifier module of claim 3, further comprising:

a third plurality of capacitors disposed within said cavity and connected between said plurality of amplifiers and said first supply voltage source, each of said third plurality of capacitors being adapted to filter noise from said amplifiers;

a plurality of gate bias circuits, each of which being applied to a corresponding amplifier of said plurality of amplifiers.

5. A broadband power amplifier module of claim 3, wherein said at least one conical inductor is mounted within said cavity on a ceramic stand.

6. A broadband power amplifier module of claim 3, wherein said cavity houses a substrate and said second supply voltage source is connected to said substrate through a via hole.

7. A broadband power amplifier module of claim 1, wherein said at least one conical inductor is mounted within said cavity on a ceramic stand.

8. A broadband power amplifier module of claim 1, wherein said predetermined bandwidth for said conical inductor is at least from 100 MHz to 9 GHz.

9. A broadband power amplifier module of claim 1, further comprising a toroidal inductor coupled between said at least one inductor and said first supply voltage source.

10. A broadband power amplifier module of claim 1, wherein said cavity is less than 0.6 cubic inches in volume.

11. A broadband power amplifier module, comprising:
a cavity with at least an input terminal, an output terminal, a detected output terminal;
a plurality of amplifiers disposed within said cavity, said plurality of amplifiers being connected in series from said input terminal to said output terminal;
at least one conical inductor disposed within said cavity, connected to a node formed between an amplifier output node of said amplifiers and a first supply voltage source, said conical inductor having a generally constant impedance over a predetermined bandwidth;
a first plurality of parallel plate-type capacitors disposed within said cavity, connected to a node formed between said amplifier output node and said output terminal, said first plurality of capacitors having a predetermined self-resonant frequency that is higher than said predetermined bandwidth;
a power detector circuit disposed within said cavity and connected to an output node formed between said first plurality of capacitors and said output terminal, said power detector circuit comprising:
a resistor divider connected between said output node and a second supply voltage source, said divider adapted to generate a detector input voltage that is of a predetermined fraction of a signal at said output node;
a detection diode adapted to detect voltage levels of said detector input voltage to generate a detector output voltage;
a second plurality of capacitors coupled to said detector diode, each of said second plurality of capacitors being adapted to low-pass filter and suppress RF signal in said detector output voltage over a predetermined frequency bandwidth;
a ¼-wave radial stub also coupled to said detector diode, said radial stub being adapted to filter RF signal in said detector output voltage over a range near the high end of the frequency band.

12. A broadband power amplifier module of claim 11, further comprising:
¼-wave stub connected to a node formed between said resistor divider and said second supply voltage source, said stub to provide for the resistor divider an RF ground for frequencies near the high end of the band.

13. A broadband power amplifier module of claim 11, wherein said at least one conical inductor is mounted within said cavity on a ceramic stand.

14. A broadband power amplifier module of claim 11, wherein said predetermined bandwidth for said conical inductor is at least from 1 MHz to 10 GHz.

15. A broadband power amplifier module of claim 11, wherein said cavity houses a substrate and said second supply voltage source is connected to said substrate through a via hole.

16. A broadband power amplifier module of claim 11, further comprising a toroidal inductor coupled between said at least one inductor and said first supply voltage source.

17. A broadband power amplifier module of claim 11, wherein said cavity is less than 0.5 cubic inches in volume.

18. A modulator driver module for OC-192 or OC-768 communications, comprising:
at least one cavity with at least one input terminal and one output terminal;
a plurality of amplifiers disposed within said cavity, said plurality of amplifiers being connected in series from said input terminal to said output terminal;
at least one conical inductor disposed within said cavity and connected to an amplifier output node of said plurality of amplifiers, said conical inductor being adapted to provide a predetermined high impedance over a predetermined bandwidth;
a first plurality of capacitors disposed within said cavity and connected between said amplifier output node and said output terminal, said plurality of capacitors being adapted to provide DC blocking for said output terminal.

19. A modulator driver module of claim 18, further comprising:
a voltage divider disposed within said cavity and connected to said amplifier output node, said voltage divider being adapted to generate a reduced signal from said amplifier output node;
a detection diode disposed within said cavity and connected to said voltage divider, said detection diode being adapted to detect a DC voltage level of said reduced signal;
a first ¼-wave stub disposed within said cavity and connected to said detection diode, said first ¼-wave stub being adapted to filter RF energy detected by said detection diode;
a second plurality of capacitors disposed within said cavity and connected to said detection diode, said capacitors being adapted to filter RF energy detected by said detection diode.

20. A modulator driver module of claim 19, further comprising:
a second ¼-wave stub disposed within said cavity and connected to said voltage divider, said second ¼-wave stub being adapted to provide grounding.

21. A modulator driver module of claim 20, further comprising:
a third plurality of capacitors disposed within said cavity, said third plurality of capacitors being adapted to filter noise from said plurality of amplifiers;
a plurality of gate bias circuits disposed within said cavity, said plurality of gate bias circuits being adapted to bias said plurality of amplifiers.

22. A modulator driver module of claim 19, wherein said voltage divider comprises a resistor voltage divider.

23. A modular driver module of claim 18, wherein said at least one conical inductor is mounted within said cavity on a ceramic stand.

24. A broadband power amplifier module of claim 18, wherein said predetermined bandwidth for said conical inductor is at least from 100 MHz to 10 GHz.

25. A modulator driver module of claim 18, wherein said predetermined bandwidth for said conical inductor is at least from 50 KHz to 15 GHz.

26. A modulator driver module of claim 18, further comprising a toroidal inductor coupled between said at least one inductor and a first supply voltage source.

27. A broadband power amplifier module of claim 18, wherein said cavity is less than 0.3 cubic inches in volume.

28. A broadband power amplifier module for high bit-rate SONET/SDH transmission channels, comprising:

at least one cavity;

broadband amplifier means disposed within said cavity for amplifying an input signal from an input stage and generating an output to an output state;

conical inductor means disposed within said cavity and coupled to output stage of said amplifier means for providing high impedance over a predetermined bandwidth;

first capacitor means disposed within said cavity and coupled to said output stage of said amplifier means for providing DC blocking.

29. A broadband power amplifier module claim 28, further comprising:

voltage divider means disposed within said cavity and coupled to said output stage for generating a signal of reduced voltage level from said output;

detector means disposed within said cavity and coupled to said voltage divider for detecting said signal of reduced voltage level;

RF filter means disposed within said cavity and coupled to said detector means for filtering RF energy from said signal;

second capacitor means disposed within said cavity and coupled to said detection diode for providing low-pass filtering of lower frequency bands and minimizing amplitude variation over frequency from said detector means.

30. A broadband power amplifier module of claim 29, further comprising:

third capacitor means disposed within said cavity and coupled to said amplifier means for filtering out noise in power supply and for isolating said amplifier means.

31. A broadband power amplifier module of claim 29, wherein said inductor means comprises a conical shape inductor mounted on a ceramic stand.

32. A broadband power amplifier module of claim 28, wherein said inductor means comprises a conical shape inductor mounted on a ceramic stand.

33. A broadband power amplifier module of claim 32, wherein said inductor means further comprises a toroidal inductor coupled between said conical shape inductor and a first supply voltage source.

34. A broadband power amplifier module of claim 23, wherein said inductor means has a predetermined impedance over a bandwidth of at least from 100 MHz to 9 GHz.

\* \* \* \* \*